(12) United States Patent
Tsukagoshi et al.

(10) Patent No.: US 6,833,980 B1
(45) Date of Patent: Dec. 21, 2004

(54) MAGNETOELECTRIC DEVICE

(75) Inventors: Kazuhito Tsukagoshi, Saitama (JP); Bruce William Alphenaar, Cambridge (GB); Hiroshi Mizuta, Milton (GB)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/504,623

(22) Filed: Feb. 15, 2000

(30) Foreign Application Priority Data

May 10, 1999 (EP) .............................. 99303605

(51) Int. Cl.[7] ............................ G11B 5/33; G11B 33/02
(52) U.S. Cl. ....................................... 360/324; 324/252
(58) Field of Search ............................ 360/324, 324.1, 360/324.11, 324.12, 324.2; 324/207.21, 252; 257/40, 423

(56) References Cited

U.S. PATENT DOCUMENTS

| | | | |
|---|---|---|---|
| 5,365,078 A | * 11/1994 | Hayashi et al. ................ | 257/24 |
| 5,654,566 A | * 8/1997 | Johnson ....................... | 257/295 |
| 5,726,837 A | 3/1998 | Nakatani et al. ............ | 360/113 |
| 5,747,859 A | 5/1998 | Mizushima et al. ......... | 257/421 |
| 5,814,290 A | * 9/1998 | Niu et al. .................... | 423/344 |
| 5,916,642 A | * 6/1999 | Chang ......................... | 29/509 |
| 6,129,901 A | * 10/2000 | Moskovits et al. ....... | 423/447.3 |
| 6,172,902 B1 | * 1/2001 | Wegrowe et al. ........... | 365/158 |
| 6,205,008 B1 | * 3/2001 | Gijs et al. ................... | 360/324 |
| 6,265,466 B1 | * 7/2001 | Glatkowski et al. ........ | 523/137 |
| 2001/0028872 A1 | * 10/2001 | Iwasaki et al. ........... | 423/447.3 |

FOREIGN PATENT DOCUMENTS

WO    WO98/25263    6/1998

OTHER PUBLICATIONS

IEEE Transactions on Magnetics, vol. 32, No. 4, Jul. 1996; Schwarzacher W. and Lashmore D.S.: "Giant Magnetoresistance in Electrodeposited Films," pp. 3133–3152.*

Journal of Experimental and Theoretical Physics, vol. 86, No. 6, Jun. 1998; Tsebro V I et al.: *Temperature Dependence of Electric Resistance and Magnetoresistance of Pressed Nanocomposites of Multilayer Nanotubes with the Structure of Nested Cones*, pp. 1216–1219.

Journal of Magnetism and Magnetic Materials 139 (1995) L231–L234, T. Miyazaki & N. Tezuka: *Giant Magnetic Tunneling Effect in Fe/Al2O3/Fe Junction*.

Nikkei Electronics 1997, 47 No. 686, pp. 125–129: *TMR As a Promising Device for Third Generation Hard Disk Drive Heads*.

* cited by examiner

*Primary Examiner*—Carl Whitehead, Jr.
*Assistant Examiner*—Jennifer M Dolan
(74) *Attorney, Agent, or Firm*—Kenyon & Kenyon (57) ABSTRACT

A magnetoelectric device responsive to an applied magnetic field, e.g. for use as a reading head for data stored in magnetic storage media, comprises first and second ferromagnetic regions (3, 4) with a channel region (5) between them, the ferromagnetic regions being configured so that charge carriers with a particular spin polarization which can pass through the first region, pass through the second region as a function of the relative orientations of magnetization of the ferromagnetic regions produced by the applied magnetic field such that the device exhibits a conductivity as a function of the strength of the applied field. The channel region (5) includes a nanotube (6) which may be formed of carbon, configured to provide a quasi-one-dimensional channel to cause charge carriers which pass through the first ferromagnetic region to maintain their spin polarization as they pass towards the second ferromagnetic region. In an alternative embodiment a deposited carbon layer (14) is used in the channel region.

19 Claims, 12 Drawing Sheets

| | FIELD STRENGTH | SPIN ORIENTATION | | RESISTANCE | ROW |
|---|---|---|---|---|---|
| | | LAYER 3 | LAYER 4 | | |
| A | HIGH POSITIVE | ↑ | ↑ | LOW | 1 |
| B | LOW | ↑ | ↓ | HIGH | 2 |
| C | HIGH NEGATIVE | ↓ | ↓ | LOW | 3 |

MAGNETOELECTRIC DEVICE

FIELD OF THE INVENTION

This invention relates to a magnetoelectric device responsive to an applied magnetic field, which has particular but not exclusive application to a magnetic reading head for reading data from magnetic storage media.

BACKGROUND

Large magnetoresistance can be observed in certain structures that include regions of ferromagnetic material which are separated by regions of non-magnetic material. In these structures, the resistance drops dramatically as a magnetic field is applied, the change being much greater than for a single ferromagnetic film. The effect is believed to be due to relative alignment of the magnetisation directions of different layers of the structure. For example, considering a structure that comprises first and second ferromagnetic layers, when the magnetisation direction of the two ferromagnetic layers are aligned in anti-parallel, electrons with a particular spin can pass through one of the layers but are blocked by the other layer and cannot pass through it. However, in response to an applied magnetic field, the magnetisation direction of one of the layers can be made to flip into parallel with the other layer. Then, electrons with a spin orientation that can pass through the first ferromagnetic layer, will also freely pass through the second ferromagnetic layer, resulting in a relatively low resistance. The effect can be used to detect the presence of an applied magnetic field.

A giant magnetic tunnelling effect has been observed in cobalt containing ferromagnetic layers spaced apart by an insulating tunnelling barrier of aluminium oxide, as described by T. Miyazaka and N. Tezuka "Giant Magnetic Tunnelling Effect in Fe/$Al_2O_3$/Fe junction", J. Magn. Magn. Mater. 139, L231–L234. It has been proposed to use a magnetoelectric device of this general configuration in a magnetic reading head, as described in "TMR as a promising device for third generation hard disk drive heads" Nikkei Electronics 1997, 47 No. 686 pp 125–129. The magnetoelectric device used in the reading head comprises first and second overlying ferromagnetic layers formed of cobalt with a thickness of 3.3 nm, sandwiching a tunnelling insulating $Al_2O_3$ layer of thickness 1.3 nm, to act as a thin tunnelling barrier to channel electrons between the ferromagnetic layers. The various layers are deposited sequentially on an insulating substrate. The tunnel barrier of $Al_2O_3$ is formed by oxidising a thin aluminium layer deposited on one of the cobalt layers. The oxidisation process takes 10 hours or longer which slows the manufacturing process. Furthermore, the aluminium oxide film needs to have a high quality and uniformity in order to render the device sensitive to an applied magnetic field. Short circuits due to pin holes through the tunnelling barrier constitute a serious problem. Furthermore, the magnetoelectric device needs to be made sufficiently small to detect individual storage areas on magnetic media with the result that the resistance through the device is relatively high and sensitive to external noise.

SUMMARY OF THE INVENTION

The present invention seeks to provide an improved device which overcomes these problems.

According to the invention there is provided a magnetoelectric device responsive to an applied magnetic field, comprising first and second ferromagnetic regions with a channel region between them, the ferromagnetic regions being configured so that charge carriers with a particular spin polarisation which can pass through the first region, pass through the second region as a function of the relative orientations of magnetisation of the ferromagnetic regions produced by the applied magnetic field whereby the device exhibits a conductivity as a function of the strength of the applied field, wherein that the channel region is configured to provide a quasi-one-dimensional channel to cause charge carriers which pass through the first ferromagnetic region to maintain their spin polarisation as they pass towards the second ferromagnetic region.

The quasi-one-dimensional channel may comprise a nanotube, which may be formed of carbon. The channel region may comprise a bundle of such nanotubes.

The channel region in another aspect of the invention may comprise a layer of graphite or a diamond layer.

The invention also includes a magnetoelectric device responsive to an applied magnetic field, comprising first and second ferromagnetic regions with a channel region between them, characterised in that the channel region includes a carbon containing material.

The invention also includes a magnetoelectric device responsive to an applied magnetic field, comprising first and second ferromagnetic regions with a channel region between them characterised in that the channel region includes a nanotube.

BRIEF DESCRIPTION OF THE DRAWINGS

In order that the invention may be more fully understood an embodiment thereof will now be described by way of example with reference to the accompanying drawings in which.

DETAILED DESCRIPTION

Figure 1:
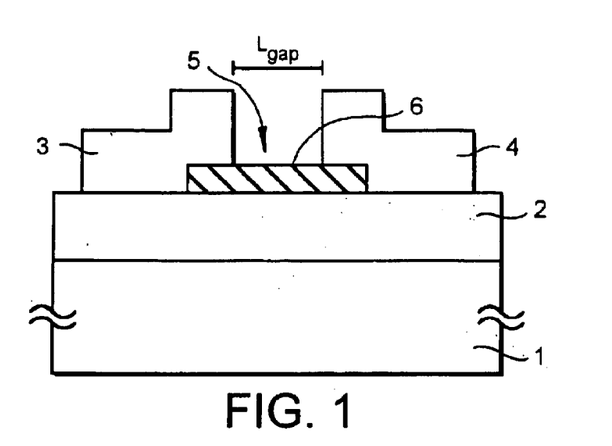
FIG. 1 is a schematic cross sectional view of the first example of magnetoelectric device according to the invention.
Figure 2:
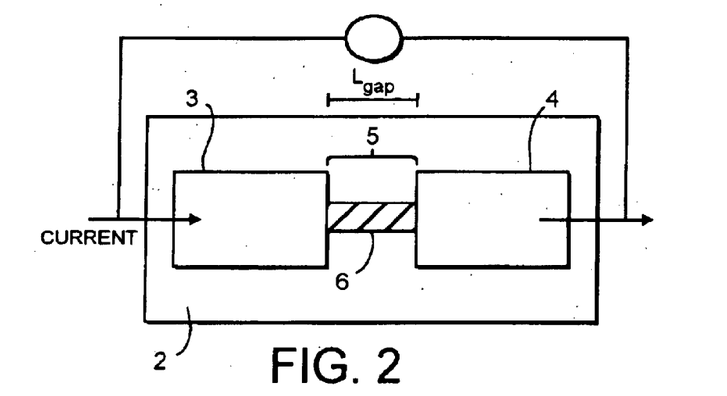
FIG. 2 is a schematic plan view of the device shown in FIG. 1.
Figure 3:
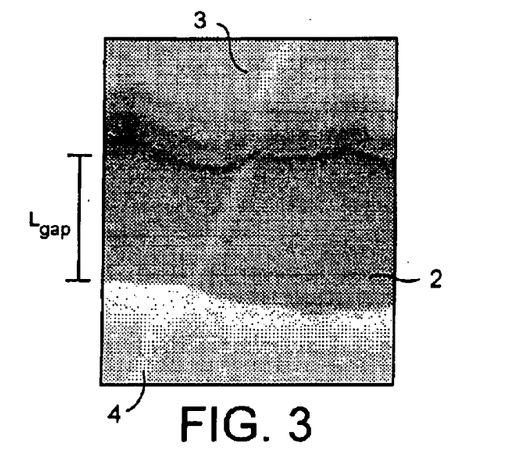
FIG. 3 is an electron beam micrograph of the channel region of the device shown in FIGS. 1 and 2.

A first embodiment of a magnetoelectric device according to the invention is shown in FIGS. 1 to 3. Referring to the sectional view of FIG. 1, the device comprises generally planar support 1 which may comprise a semiconductor wafer or could comprise a metal plate. An insulating substrate 2 is formed on the wafer 1 e.g. of $SiO_2$ or SiN. First and second ferromagnetic regions 3, 4 are formed on the substrate 2, with a channel region 5 between them. In this embodiment, the channel region 5 has a width $L_{gap}$ between the first and second ferromagnetic regions 3, 4 which may be of the order of 250 nm. The ferromagnetic regions 3,4 may be made of cobalt deposited to a thickness of 50–100 nm. Typical dimensions for the region 3 are 2 by 2 microns although the invention is not restricted to these dimensions. As will be explained in more detail later, the regions 3,4 have slightly different surface areas to give them asymmetrical magnetisation characteristics.

In this example of the invention, a carbon nanotube 6 extends through the channel region 5 between the ferromagnetic regions 3, 4 in order to channel electrons between them. The direction of current flow is shown by arrow n FIG. 2. As known in the art, carbon nanotubes comprise hollow, generally cylindrical members with a diameter typically in the range of 1.4–20 nm and a length of the order of 65 micrometers. Either single or multi-walled nanotubes can be used. Carbon nanotubes are commercially available from Shinku Yakin K.K. of Japan. Nanotubes are described in more detail in "Physical Properties of Carbon Nanotubes," R. Saito, G. Dresselhaus and M. S. Dresselhaus, Imperial College Press, London, 1998.

Figure 4:
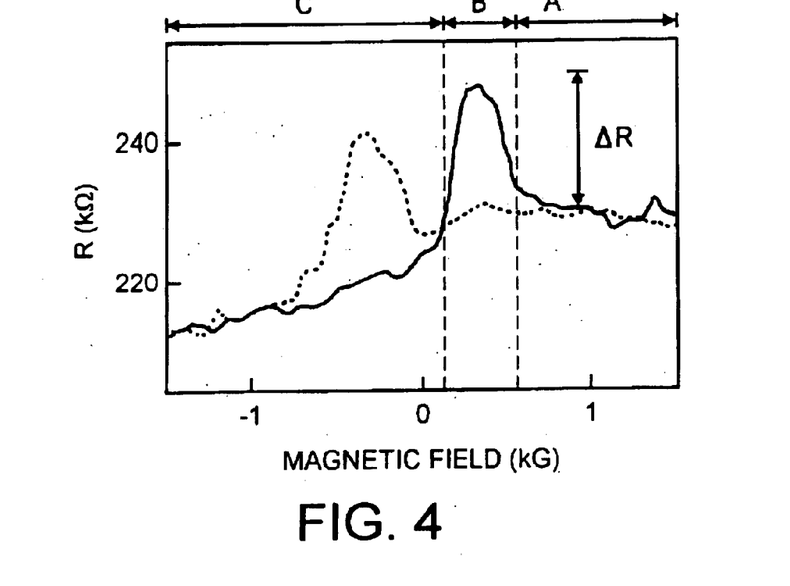
FIG. 4 is a graph of the resistance of the device as a function of applied magnetic field.

FIG. 4 illustrates the resistive characteristics of the device in the presence of a magnetic field. When a relatively high magnetic field is applied to the magnetoelectric device (region A) the high field causes the magnetisation directions for the ferromagnetic regions 3, 4 to become aligned with the field. A characteristic of ferromagnetic material is that the majority of the conduction electrons have a spin-orientation corresponding to the magnetisation direction of the ferromagnetic material. For instance, in the high positive field condition A, the majority of electrons in layer 4 will have a spin orientation corresponding to the upright arrow shown in FIG. 5 (row 1). The electrons pass from the layer 4 through the carbon nanotube 6 to the ferromagnetic layer 3 with little spin scattering, due to carbon nanotube having a large spin-scattering length. The high field, as previously explained, aligns the magnetisation directions for the layers 3 and 4 in parallel. Since the majority spin states are also aligned, the device exhibits a relatively low resistance.

Figure 5:
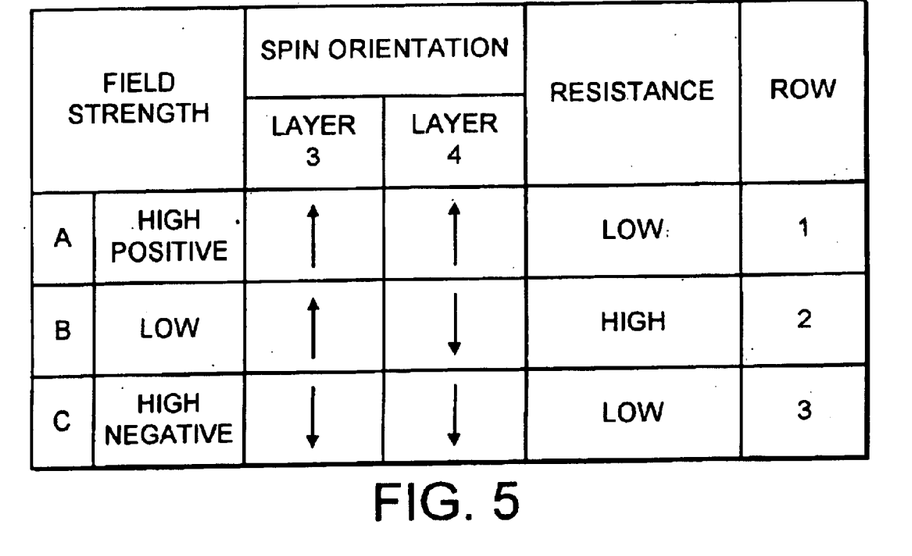
FIG. 5 is a table illustrating the relationship between resistance, spin orientation and field strength.

When the field is reduced to a low value (region B of FIG. 4) one of the layers 3, 4 flips its magnetisation direction into an anti-parallel configuration as shown in row 2 of FIG. 5. In this situation, the majority spin states are out of alignment. As a result, the device exhibits high resistance.

The flipping of one of the layers into the antiparallel magnetisation configuration in the low strength field, results from the layers 3, 4 exhibiting slightly different bulk coercivities due to their different surface areas, so that one of the layers flips its orientation direction before the other in response to the decreasing field.

If the field direction is reversed and a high negative field is applied, the magnetisation of the second layer eventually also flips in the direction of the applied field. In this situation, the majority spin states of both layers are once again aligned, so the device exhibits a relatively low electrical resistance, as shown in row 3 of FIG. 5.

The ferromagnetic layers 3, 4 exhibit hysteresis so that when the magnetic field is reversed, the characteristic shown in dotted outline in FIG. 4 is produced.

It has been found in accordance with the invention, that the use of the carbon nanotube 6 gives rise to an improved differential resistance $\Delta R$ between the high and low field states, as compared with prior art devices using an $Al_2O_3$ tunnel barrier layer. The reason for the improvement is not fully understood but a characteristic of the carbon nanotube is that it provides a quasi-one-dimensional channel extending between the ferromagnetic regions 3, 4 and it is postulated that this permits the spin polarised electrons emerging from ferromagnetic layer 4 to retain their spin polarisation as they are carried into the second ferromagnetic layer 3, with minimal scattering, thereby increasing the value of $\Delta R$.

Figure 6A:
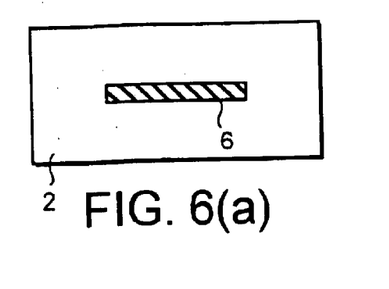
FIG. 6a–h illustrate process steps of a first fabrication method of making a device according to the invention showing the various steps in plan and sectional view respectively.
Figure 6B:
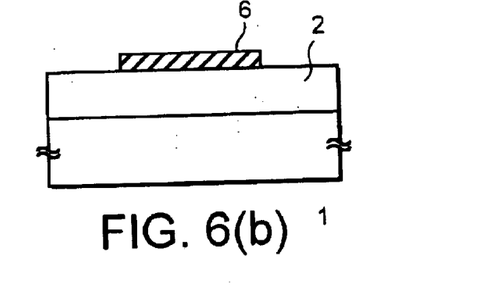

A method of manufacturing the device shown in FIGS. 1 to 3 will now be described with reference to FIG. 6. As shown in FIG. 6a, and the corresponding sectional view 6b, the semiconductor substrate 1 is formed with an oxide layer 2 to a thickness of 200 nm. Then, carbon nanotube 6 is placed on the surface. This is carried out by forming a suspension of nanotubes in dichloroethane and using ultrasound to homogenise the suspension. The resulting liquid suspension is then spread over the oxide layer 2 and dried so as to deposit the nanotubes. One of the nanotubes is then located on the surface using a microscope (not shown).

Figure 6C:
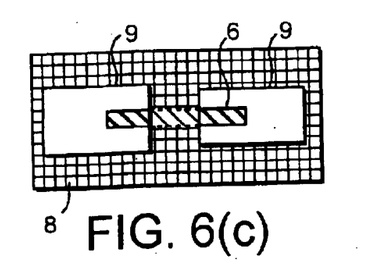
Figure 6D:
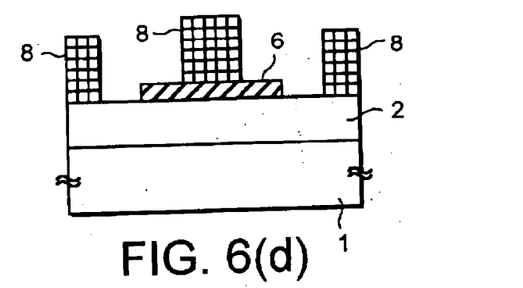

As shown in FIG. 6e and the corresponding sectional view 6d, a layer of electron beam resist material 8 is applied. A suitable example is NANO PMMA resist produced by Microlithography Corporation. The resist layer 8 is subject to an electron-beam lithographic process which defines areas 9 for the eventual ferromagnetic regions 3, 4, at opposite ends of the nanotube 6. Alternatively, a high resolution optical lithographic technique can be used with a suitable resist in order to form the areas 9.

Figure 6E:
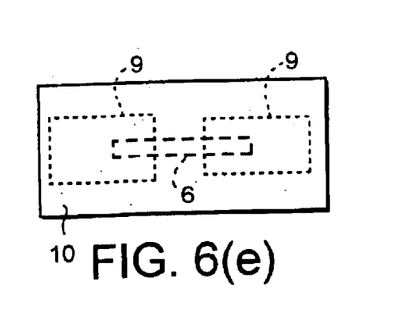
Figure 6F:
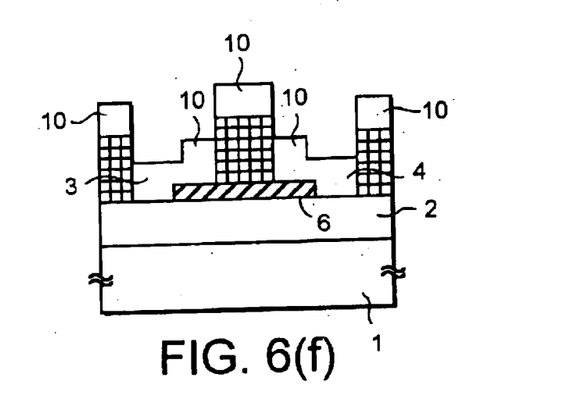
Figure 6G:
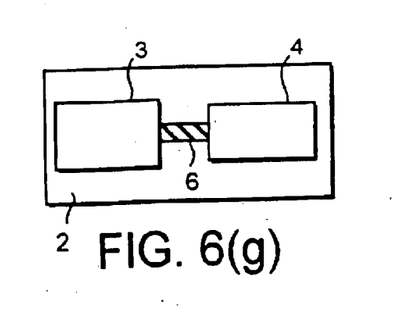
Figure 6H:
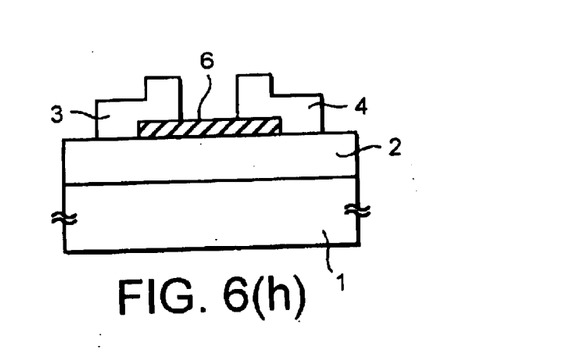

Then, referring to FIGS. 6e, f, a layer 10 of cobalt ferromagnetic material is deposited by thermal evaporation to a thickness of 50–100 nm at a pressure of $4 \times 10^{-7}$ torr, at room temperature. E-beam evaporation could alternatively be used. Then, as shown in FIGS. 6g, h, the resist 8 is removed by dissolving it with acetone so as to leave the first and second ferromagnetic regions 3, 4 on the substrate, electrically connected to opposite ends of the nanotube 6. It will be noted that the ferromagnetic region 3 is larger than the corresponding region 4 in surface area to ensure asymmetrical flipping of the associated electron spin states, as previously described.

Additional metallic contact layers of Au (not shown) are provided on the ferromagnetic regions 3, 4 to allow an external voltage source to be connected so that the resistance of the device can be measured to detect an applied magnetic field.

Figure 7A:
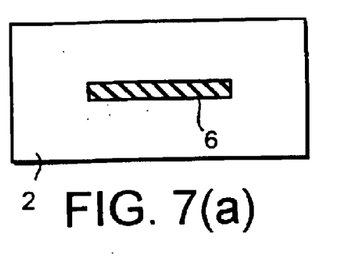
FIG. 7a–n correspondingly illustrate a second fabrication method for a device according to the invention.
Figure 7B:
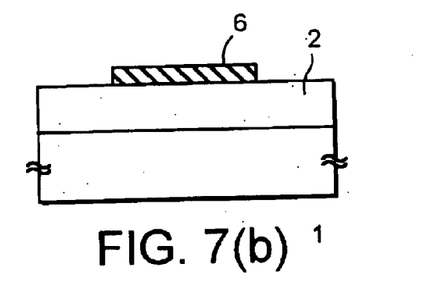
Figure 7C:
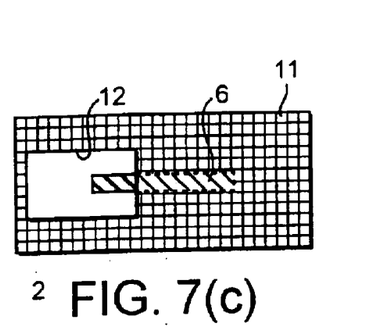
Figure 7D:
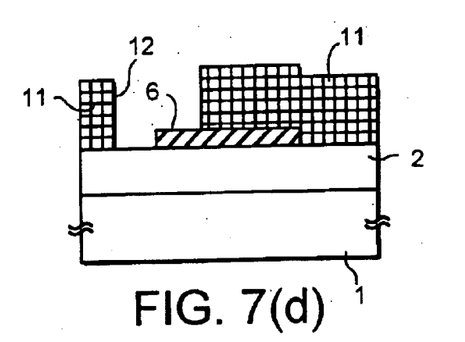

This manufacturing process deposits the same ferromagnetic material for both of the ferromagnetic regions 3, 4. However, an alternative process may be used to allow different ferromagnetic materials to be used for the individual regions. In this way, different ferromagnetic regions with different coersivities can be provided to provide asymmetrical flipping of their spin states in response to the applied field. The process will now be described with reference to FIG. 7. As shown in FIGS. 7a and b, the substrate 1, oxide layer 2 and nanotube 6 are prepared as previously described. Then, as shown in FIGS. 7c, d, a photoresist layer 11 is applied and a window 12 is opened in it as previously described for the layer 8, to define the ferromagnetic region 3 overlying one end of the nanotube 6.

Figure 7E:
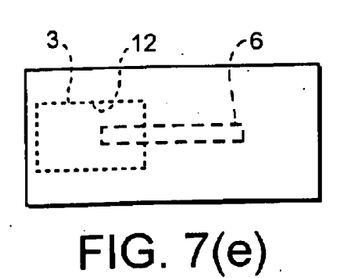
Figure 7F:
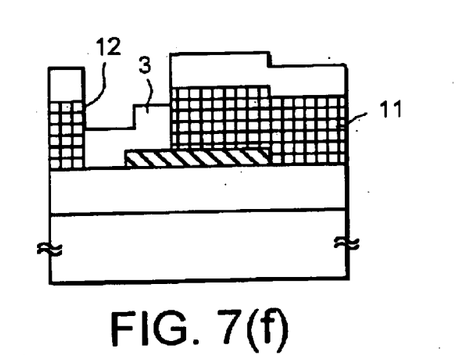

Then, as shown in FIGS. 7e, f, a first ferromagnetic film is deposited to a thickness of 30–35 nm so as to form the ferromagnetic region 3 in the opening 12 of a first ferromagnetic material. Suitable examples are Co, Ni and Fe. Suitable deposition conditions are room temperature and a pressure of $4 \times 10^{-7}$ torr.

Figure 7G:
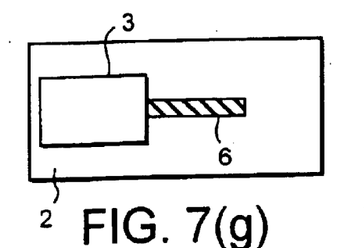
Figure 7H:
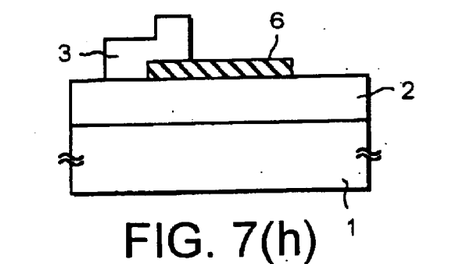

Then, the photoresist material and the overlying ferromagnetic material is removed by a conventional lift-off method in which the resist is dissolved in acetone so as to provide the configuration shown in FIGS. 7g, h, with the ferromagnetic region 3 contacting one end of the carbon nanotube 6.

Figure 7I:
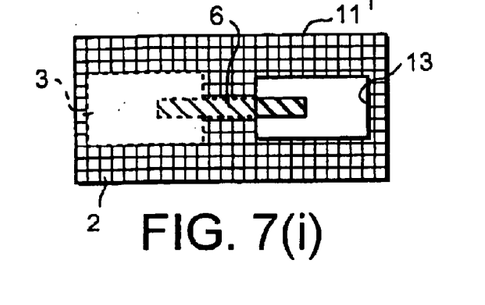
Figure 7J:
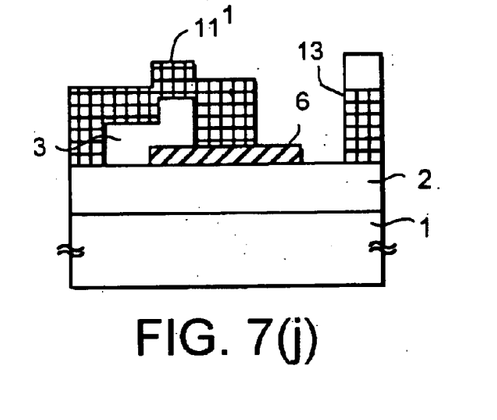
Figure 7K:
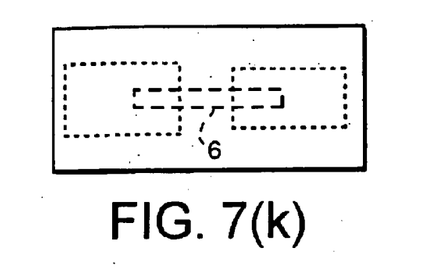
Figure 7L:
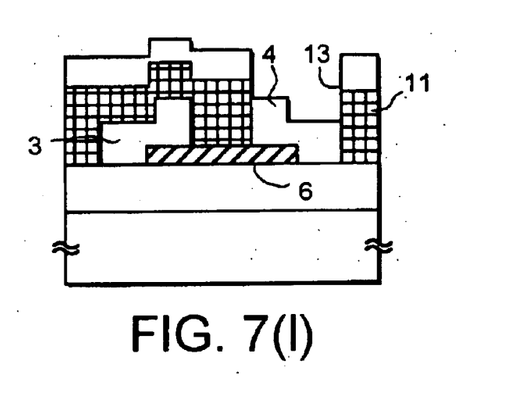
Figure 7M:
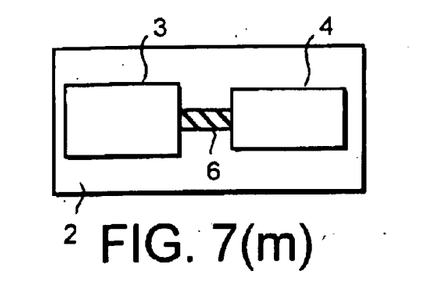
Figure 7N:
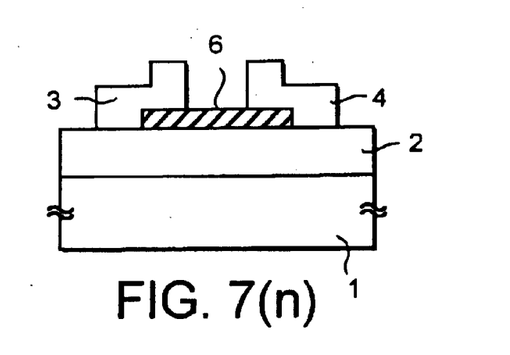

A similar process is then repeated at the other end of the nanotube 6. Referring to FIGS. 7i, j, another layer 11' of the previously described resist is applied over the surface of the substrate, covering the first ferromagnetic region 3, and a window 13 is provided in it by the conventional lithographic techniques previously described, to form an opening for the second ferromagnetic region 4, at the other end of the carbon nanotube 6. A second ferromagnetic material is then applied, in the same way as the first region 3, so as to form the second ferromagnetic region 4 to a thickness of 30–35 nm under the same conditions of temperature and pressure as for region 3. The material for the second region is in this example different from the material used for region 3. Examples are Co, Ni and Fe. The resist material is then removed so to provide the configuration shown in FIGS. 7m, n. It will be seen that the regions 3, 4 can be of the same size but because they are of different ferromagnetic materials, the spin states of the individual regions will flip at different field strengths so as to provide the characteristics shown in FIG. 4 and 5 in response to an applied magnetic field. As previously explained, additional contact regions may be provided on the individual ferromagnetic regions 3, 4 to provide external connections.

Figure 8:
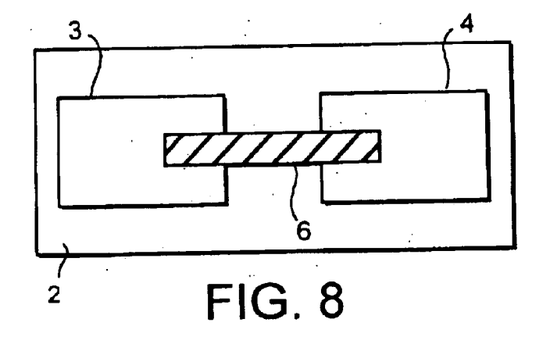
FIG. 8 is a schematic plan view of a further embodiment of magnetoelectric device according to the invention in which the carbon nanotube is configured as a bridge.
Figure 9:
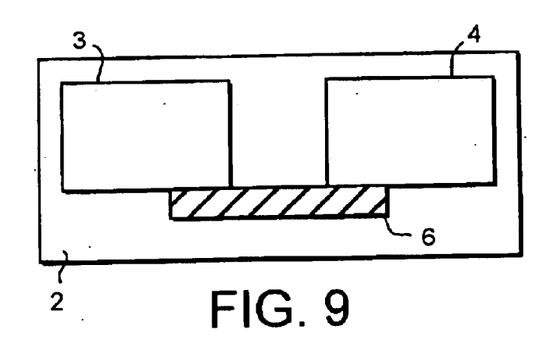
FIG. 9 is a schematic plan view of another device according to the invention in which the carbon nanotube is arranged at side edges of the ferromagnetic regions.

Various other modifications and variations fall within the scope of the invention. For example, referring to FIG. 8, the fabrication process can be modified to deposit the first and second ferromagnetic regions 3, 4 firstly and thereafter to position the carbon nanotube overlying the ferromagnetic regions as a bridge. The nanotube 6 may be positioned using an atomic force microscope or by modifying the surface of the oxide layer 2 chemically, either to attract or repel nanotubes. Also, as shown in FIG. 9, the nanotube 6 may be positioned in contact with side edges of the regions 3, 4 rather than bridging them as shown in FIG. 8.

Figure 10:
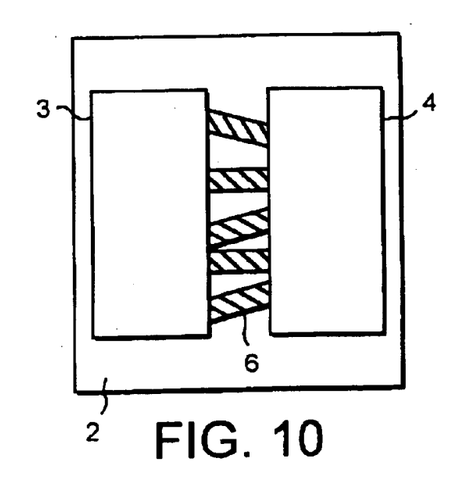
FIG. 10 is a schematic plan view of a magnetoelectric device using a plurality of carbon nanotubes.
Figure 11:
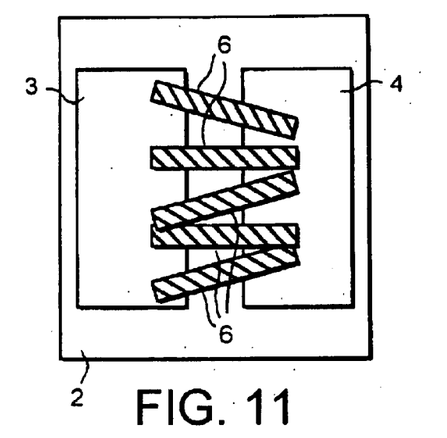
FIG. 11 is a schematic view of a device in which the plurality of nanotube are arranged in a bridge configuration.
Figure 12:
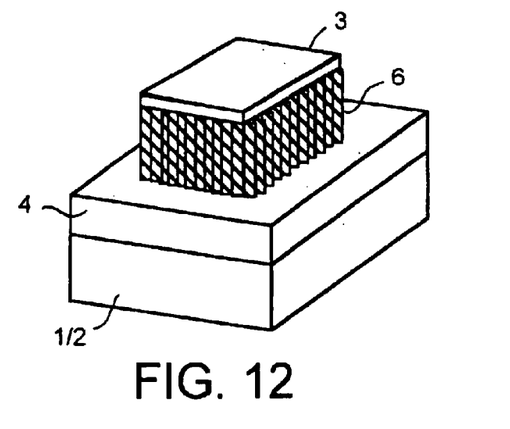
FIG. 12 illustrates in perspective view another device according to the invention using a bundle of nanotubes upstanding from the substrate.

Furthermore, in order to reduce the electrical resistance, a plurality of nanotubes 6 may be used as shown in FIGS. 10 and 11. In FIG. 10, the nanotubes 6 are arranged in contact with ferromagnetic regions 3, 4 formed by either of the processes previously described with reference to FIGS. 6 and 7. Alternatively, the nanotubes may bridge the ferromagnetic regions 3, 4 as shown in FIG. 11. In another modification shown in FIG. 12, the nanotubes 6 are arranged upstanding from the substrate 2 with the ferromagnetic regions 3, 4 above and below their ends.

Figure 13:
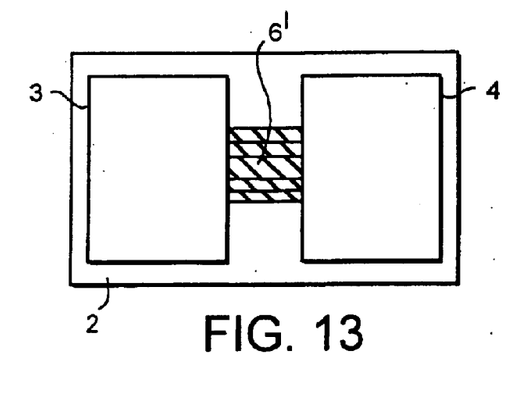
FIG. 13 illustrates in plan view another device according to the invention using a bundle of nanotubes disposed transversely on the substrate.
Figure 14:
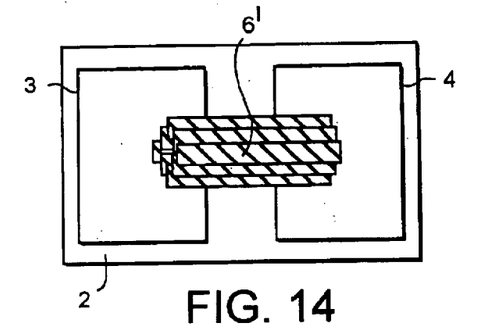
FIG. 14 illustrates another device in plan view in which the bundle of nanotubes is arranged as a bridge between the ferromagnetic regions.

As known in the art, carbon nanotubes can aggregate to form a bundle and this can be utilised in devices according to the invention to reduce the electrical resistance. For example, as shown in FIG. 13, a bundle of nanotubes 6' is used instead of a single tube on the substrate 2. Also, as shown in FIG. 14, the nanotube bundle 6' can bridge the contacts 3, 4 rather than being configured beneath them as shown in FIG. 13. A typical nanotube bundle 6' contains between two and several hundred nanotubes although the invention is not restricted to this range.

Those skilled in the art will appreciate that nanotubes can be made from other materials such as silicon or boron nitride, which may be used as alternatives to the carbon tube 6, 6'.

Figure 15:
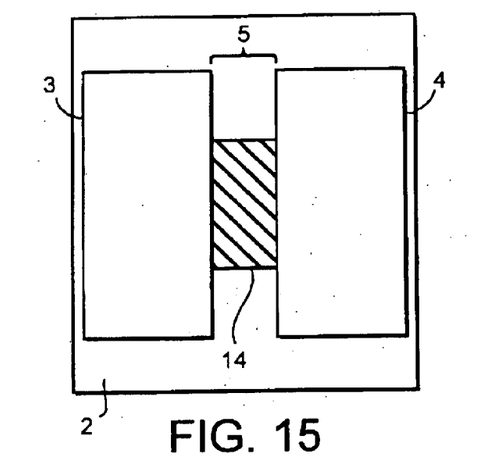
FIG. 15 is a schematic plan view of a device using a carbon graphite or diamond tunnelling region.

Further examples of the invention will now be described that use a channel region with a carbon containing material which, instead of being configured as a nanotube arranged in a carbon layer. Referring to FIG. 15, a region 14 comprising carbon graphite is formed on the substrate 2 by chemical vapour deposition (CVD) to a thickness of 100 nm and is patterned to dimensions of 100 by 100 microns using a photolithographic or e-beam lithographic technique when the substrate is initially prepared, instead of using the nanotube 6. The ferromagnetic regions 3, 4 are then applied as previously described with reference to either FIG. 6 or 7. In a modification, the graphite region 14 may be replaced by diamond.

Figure 16:
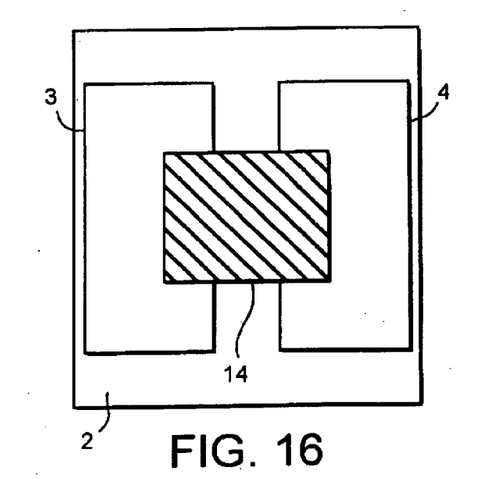
FIG. 16 corresponds to FIG. 15 in which the carbon region is arranged as a bridge between the ferromagnetic regions.

In an alternative shown in FIG. 16, the region 14 is arranged as a bridge between the ferromagnetic regions 3, 4 using conventional lithographic techniques and thermal evaporation.

Figure 17:
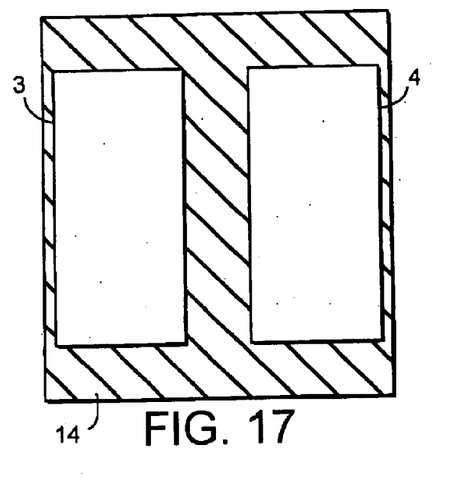
FIG. 17 is another example of a device according to the invention using a carbon graphite film on the substrate.

In an alternative shown in FIG. 17, a region of the substrate 2 that is larger than the ferromagnetic regions 3, 4 is initially deposited with the graphite or diamond layer and the ferromagnetic regions 3, 4 are formed thereon. An example of the dimensions for the region 14 is 100 by 100 microns and for the regions 3, 4 is 2 by 2 microns. The resulting magnetoelectric device that uses the carbon graphite/diamond layer exhibits an improved resistance characteristic as compared with the $Al_2O_3$ insulating layers used in the prior art.

Figure 18:
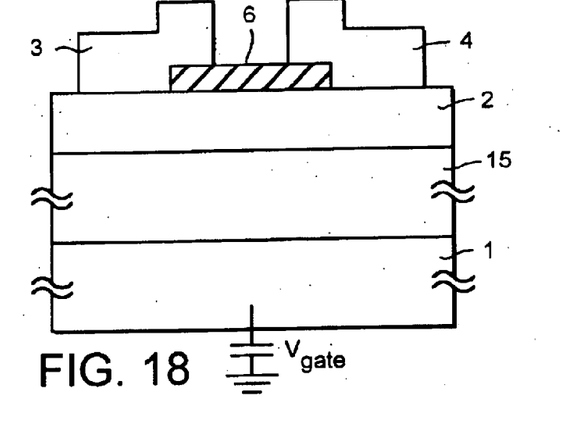
FIG. 18 illustrates a device with a doped substrate to receive a gate voltage.
Figure 19:
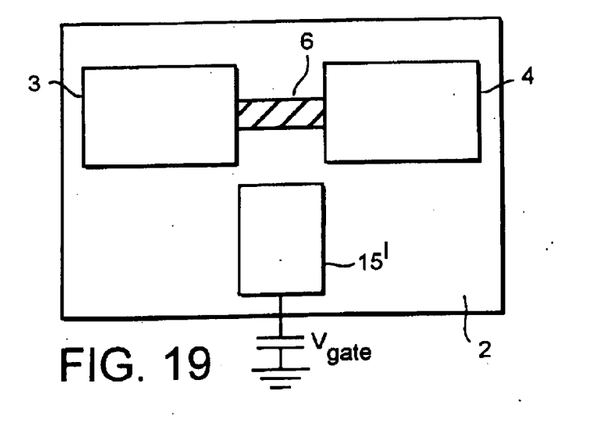
FIG. 19 is a plan view of a device according to the invention with a side gate.

The magnetoelectric device according to the invention may be provided with a gate to control its conduction characteristics. As shown in FIG. 18, an example of the device using a carbon nanotube 6 is provided with a doped region 15 in the substrate 1 to allow a gate voltage $V_{gate}$ to be applied to influence charge tunnelling through the channel region 5. In an alternative shown in FIG. 19, a side gate 15 is provided on the surface of the substrate, by conventional photolithographic techniques, to apply a field to control conduction through the tunnel channel region 5, along the nanotube 6.

Figure 20A:
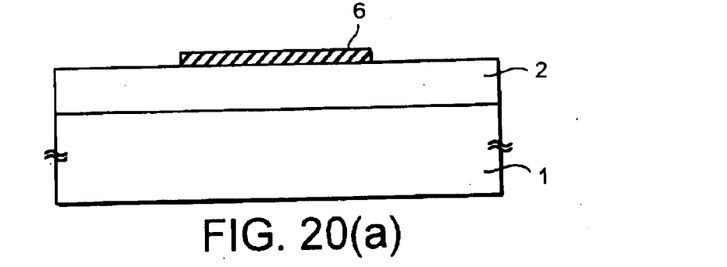
FIGS. 20a–g illustrate steps for making another example of spin device according to the invention.

Another fabrication process for a device according to the invention will now be described with reference to FIG. 20.

A silicon substrate 1 is prepared with an overlying 200 nm SiO$_2$ layer, with a nanotube 6 thereon, as previously described with reference to FIG. 1. This is shown in FIG. 20a.

Figure 20B:
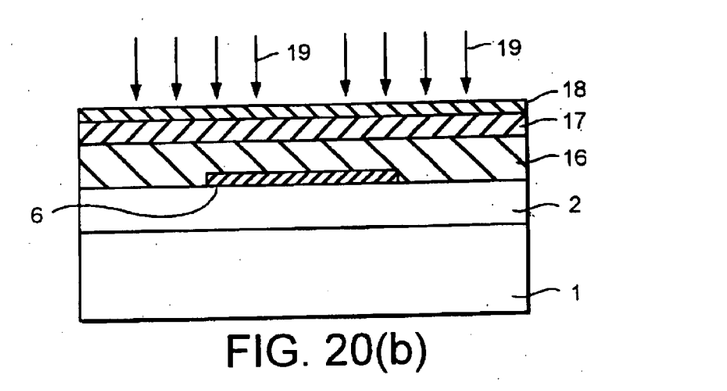

Then, as shown in FIG. 20b, a series of resist layers 16, 17, 18 are spun successively onto the substrate. The lowermost layer 16 comprises MMA or MAA and is deposited to a thickness of 300 nm. The layer 16 is overlaid by the first PMMA layer 17 of a material with a higher molecular weight than the layer 16, to a thickness of 50 nm. This is overlaid by a second layer of PMMA resist 18 of a higher molecular weight than the layer 17, to a thickness of 50 nm.

The resist layers are then exposed to an electron beam 19 which exposes regions corresponding to the eventual first and second ferromagnetic regions 3, 4, in a manner known per se.

Figure 20C:
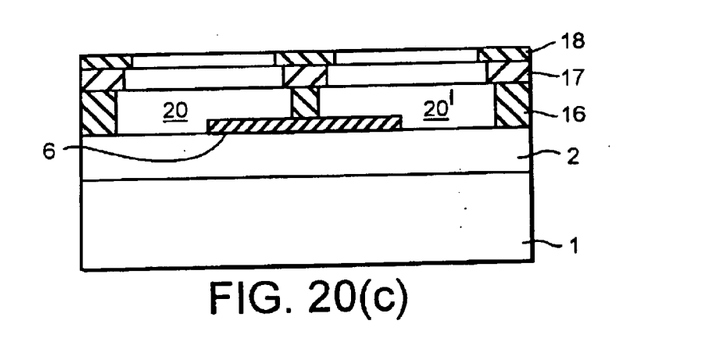

The resist layers are then developed as shown in FIG. 20c using a conventional developer such as IPA or MIBK, so as to open windows 20, 20' in the resist layers corresponding to the eventual ferromagnetic regions 3, 4, at opposite ends of the nanotube 6. The rate of dissolution of layer 16 is greater than that of layer 17, which in turn is greater than layer 18 as a result of their relative molecular weights. This gives rise to the stepped configuration of the layers 16, 17, 18 as shown in FIG. 20c.

Figure 20D:
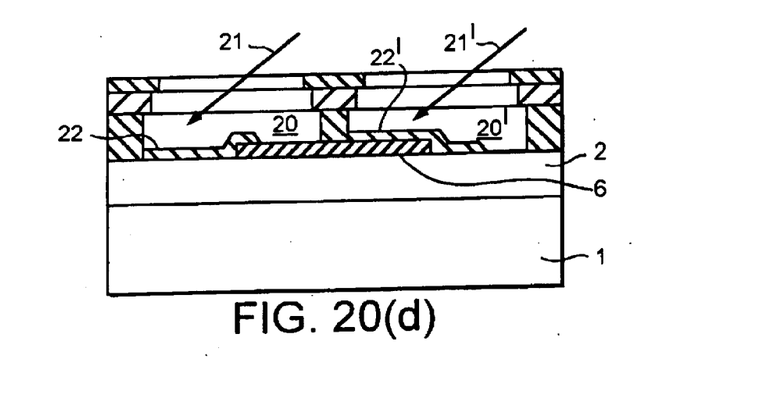
Figure 20E:
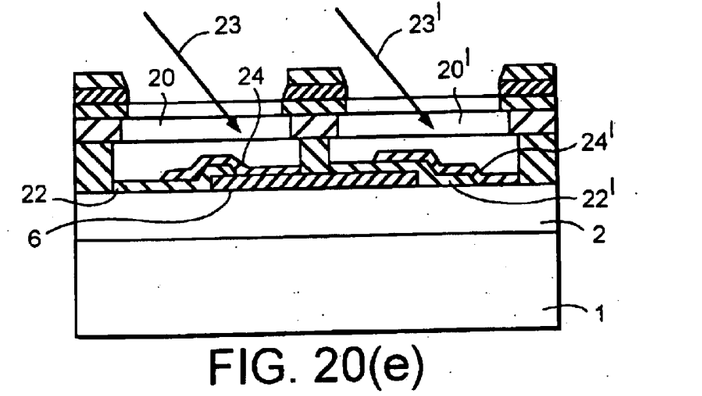

Then, the ferromagnetic materials are deposited by evaporation into the windows 20, 20'. Referring to FIG. 20d, the substrate 1 is mounted in an evacuation chamber on a pivotally mounted holder so that it can be turned at different angles relative to an induction boat (not shown) which produces a stream of evaporated material, directed towards the substrate.

Referring to FIG. 20d, the substrate 1 is pivoted so that the evaporated material is directed at an acute angle shown by arrows 21, 21' into the windows 20, 20'. As a result, 2 first ferromagnetic material, which may be Fe, Co or Ni, is deposited on the left hand side of each window 20, 20' as layers 22, 22', in electrical contact with opposite ends of the nanotube 6. The evaporation process is carried out at room temperature and at a pressure of 4×10$^{-7}$ torr. The layer 22, 22' is deposited to a thickness of 30 nm.

Then, as shown in FIG. 20d, the substrate 1 is pivoted in its holder relative to the induction boat so that a second evaporation can take place at an obtuse angle relative to the boat, so as to deposit material at the right hand side of each window 20, 20' as illustrated by arrows 23, 23'. A further ferromagnetic material is thereby deposited as layer regions 24, 24' at the right hand side of each window 20, 20'. The second ferromagnetic material 24, 24' may be of the same or different composition as compared with the material of layer 22, 22'. It will be seen that the layer 24 contacts the nanotube for the most part in the window 20, whereas the layer 24' contacts the nanotube for the most part in the opposite window 20'. Thus, ferromagnetic materials with different coersivity characteristics can be provided in the windows 20, 20' individually.

The deposition conditions for layer 23 are substantially the same as those previously described for layer 22, which is deposited to a thickness of 30 nm.

Figure 20F:
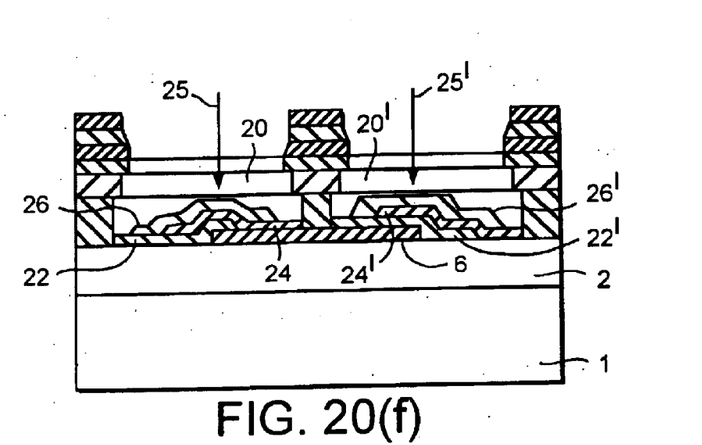

Then, as shown in FIG. 20f, the substrate is pivoted to a central position directly below the induction boat so that a further evaporation process can be carried out in the direction of the arrows 25, 25'. In this way, an overlying contact layer 26, 26' is deposited in the windows 20, 20' typically to a thickness of 60 nm. This capping layer, which may be formed of Au, protects the surface of the ferromagnetic material.

Figure 20G:
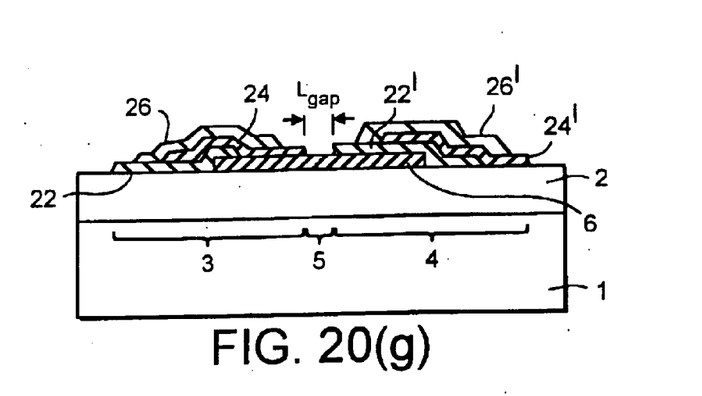

Then, as shown in FIG. 20g, the remaining resist layers are lifted off using acetone developer as previously described with reference to FIGS. 6 and 7, so as to leave the deposited layers 22, 24 and 26 at opposite ends of the nanotube 6, thereby to provide the first and second ferromagnetic regions 3, 4 with the gap 5 between them.

Figure 21:
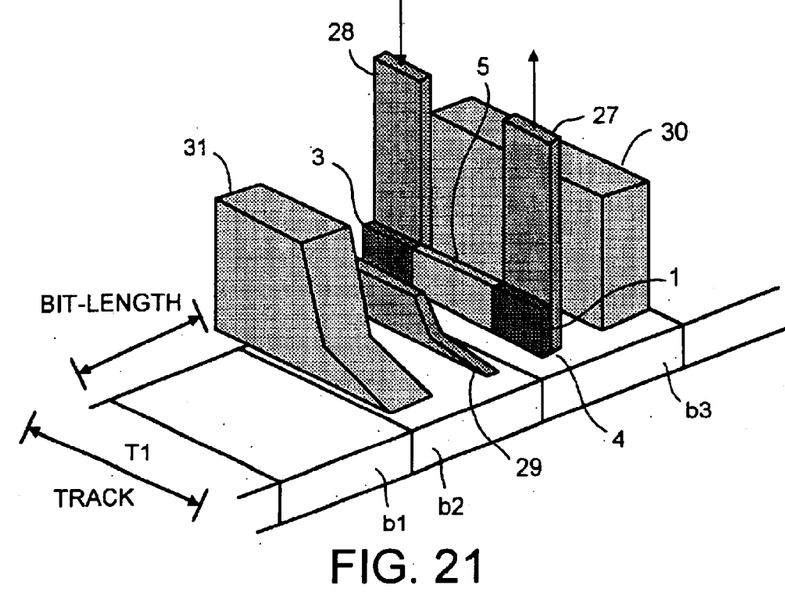
FIG. 21 illustrates a first example of a magnetic reading head incorporating a magnetoelectric device according to the invention.

FIG. 21 illustrates schematically an example of a magnetic reading head for use with magnetic storage medium such as a Winchester disc, incorporating a magnetoelectric device according to the invention. A substrate 21 incorporating the magnetoelectric device made according to any of the preceding examples is mounted between two current supply electrodes 27, 28 that are connected to the first and second ferromagnetic regions 3, 4, with channel tunnelling region 5 between them. The head is located over a magnetic storage medium such as the surface of a Winchester disc which contains tracks of magnetically recorded binary 1's and 0's. Three recorded bits b1, b2, b3, are shown schematically recorded in a track T1 in the magnetic recording medium. The bits may be recorded using a conventional induction coil (not shown) and a writing head 29 shown schematically. Magnetic shielding layers 30, 31 are provided on opposite sides of the head.

As the head is swept along the track, the applied field produced by the recorded bits changes between relatively high and low values depending on whether the underlying bit is 1 or 0. The changes in magnetic field produce corresponding changes in the current flowing between electrodes 27, 28, which can be detected by external circuitry (not shown) to detect the recorded information from the track T1.

Figure 22:
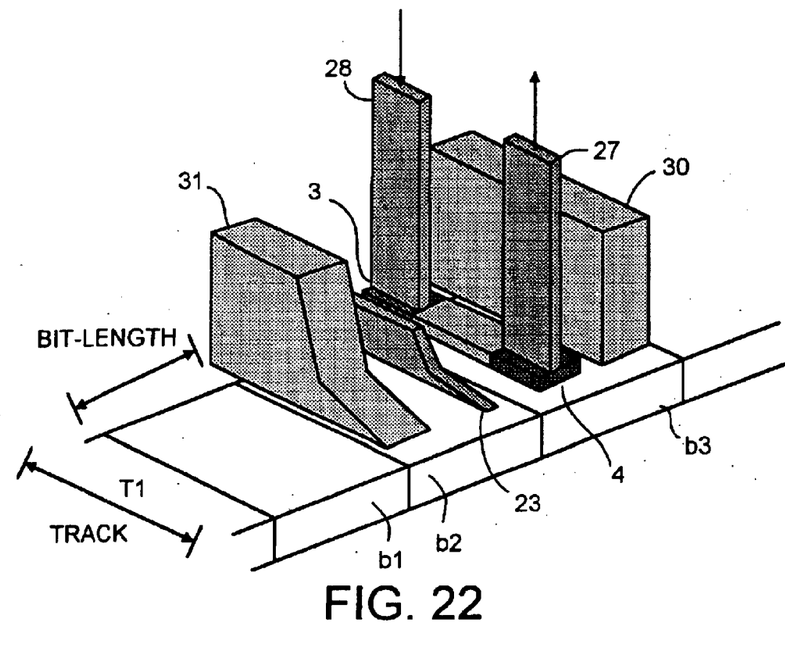
FIG. 22 illustrates another example of magnetic reading head incorporating the inventive magnetoelectric device.

A similar head is shown in FIG. 22 and like parts are marked with the same reference numbers. In this example, the substrate 21 is disposed parallel with the surface of the track T1 and the electrodes 27, 28 extend orthogonally from it in contact with the ferromagnetic regions 3, 4.

The described examples of the invention have the advantage that the resistance of the reading head is reduced significantly as compared with conventional devices using an Al$_2$O$_3$ insulating film between the ferromagnetic layers. As a result, the device is less susceptible to external noise and provides an improved signal to noise ratio is in its output.

What is claimed is:

1. A magnetoelectric device responsive to an applied magnetic field, comprising first and second ferromagnetic regions with a channel region between them, the ferromagnetic regions being configured so that charge carriers with a particular spin polarisation which can pass through the first region, pass through the second region as a function of the relative orientations of magnetisation of the ferromagnetic regions produced by the applied magnetic field whereby the device exhibits a conductivity as a function of the strength of the applied field, the channel region being configured to provide a quasi-one-dimensional channel to cause charge carriers which pass through the first ferromagnetic region to maintain their spin polarisation as they pass towards the second ferromagnetic region.

2. A magnetoelectric device according to claim 1 wherein the channel region includes a nanotube.

3. A magnetoelectric device according to claim 2 wherein the channel region comprises a bundle of nanotubes.

4. A magnetoelectric device according to claim 3 wherein the channel region comprises a layer of graphite.

5. A magnetoelectric device according to claim 3 wherein the channel region comprises a diamond layer.

6. A magnetoelectric device according to claim 2 wherein the nanotube is made of carbon.

7. A magnetoelectric device according to claim 1 wherein the channel region comprises a layer of carbon containing material.

8. A magnetoelectric device according to claim 1 wherein the first and second ferromagnetic regions comprise layers on a common substrate.

9. A magnetoelectric device according to claim 8 wherein the substrate is made of a material selected from a group consisting of a metal, glass and silicon, and is covered with an insulating layer on which the ferromagnetic layers are formed.

10. A magnetoelectric device according to claim 9 wherein the insulating layer comprises a material selected from a group consisting of silicon oxide and silicon nitride.

11. A magnetoelectric device according to claim 1 wherein the first and second ferromagnetic regions are made of a cobalt containing material.

12. A magnetoelectric device according to claim 1 including a gate to apply a field to the channel region.

13. A magnetic reading head for reading data from magnetic storage media, the head including a magnetoelectric device according to claim 1.

14. A magnetoelectric device responsive to an applied magnetic field, comprising first and second ferromagnetic regions with a channel region between them wherein the channel region includes a nanotube providing a quasi-one-dimensional channel between the first and second ferromagnetic regions.

15. A magnetoelectric device according to claim 14 wherein the channel region comprises a bundle of nanotubes.

16. A magnetoelectric device according to claim 14 wherein the nanotube is made of carbon.

17. A magnetoelectric device according to claim 14 wherein the nanotube is formed of boron nitride.

18. A magnetoelectric device according to claim 14 wherein the nanotube is formed of silicon.

19. A magnetic reading head for reading data from magnetic storage media, the head including a magnetoelectric device according to claim 14.

* * * * *